(12) United States Patent
Yamane et al.

(10) Patent No.: US 10,559,642 B2
(45) Date of Patent: Feb. 11, 2020

(54) ORGANIC LIGHT-EMITTING DEVICE HAVING A FLUORIDE AND METAL BASED INTERMEDIATE LAYER AND PRODUCTION METHOD

(71) Applicant: JOLED INC., Tokyo (JP)

(72) Inventors: Hiroaki Yamane, Osaka (JP); Masaki Nishimura, Tokyo (JP); Jun Hashimoto, Tokyo (JP); Noriyuki Matsusue, Tokyo (JP); Kazuhiro Yoneda, Tokyo (JP); Minh Hiep Hoang, Kanagawa (JP)

(73) Assignee: JOLED INC., Tokyo (JP)

( * ) Notice: Subject to any disclaimer, the term of this patent is extended or adjusted under 35 U.S.C. 154(b) by 231 days.

(21) Appl. No.: 15/300,481

(22) PCT Filed: Mar. 12, 2015

(86) PCT No.: PCT/JP2015/001358
§ 371 (c)(1),
(2) Date: Sep. 29, 2016

(87) PCT Pub. No.: WO2015/151415
PCT Pub. Date: Oct. 8, 2015

(65) Prior Publication Data
US 2017/0117347 A1   Apr. 27, 2017

(30) Foreign Application Priority Data
Mar. 31, 2014   (JP) .................................. 2014-071661

(51) Int. Cl.
*H01L 27/108*   (2006.01)
*H01L 27/32*   (2006.01)
(Continued)

(52) U.S. Cl.
CPC ...... *H01L 27/3276* (2013.01); *H01L 51/5072* (2013.01); *H01L 51/5076* (2013.01);
(Continued)

(58) Field of Classification Search
CPC ............. H01L 27/3276; H01L 51/5206; H01L 51/5092; H01L 51/05; H01L 51/5072
See application file for complete search history.

(56) References Cited

U.S. PATENT DOCUMENTS 5,776,623 A * 7/1998 Hung .................. H01L 51/5092
                                                          313/502
6,909,477 B1 * 6/2005 Yi ..................... G02F 1/136209
                                                          349/106
(Continued)

FOREIGN PATENT DOCUMENTS

JP   2004-111369   4/2004
JP   2004-335468   11/2004
(Continued)

OTHER PUBLICATIONS

International Search Report (ISR) from International Searching Authority (Japan Patent Office) in International Pat. Appl. No. PCT/JP2015/001358, dated Jun. 2, 2015.

*Primary Examiner* — Kyoung Lee
*Assistant Examiner* — Christina A Sylvia
(74) *Attorney, Agent, or Firm* — Greenblum & Bernstein, P.L.C.

(57) ABSTRACT

An organic light-emitting device including: a substrate; an anode above the substrate; wiring above the substrate, spaced away from the anode in a direction parallel to a main surface of the substrate; a light-emitting layer above the anode, containing an organic light-emitting material; an intermediate layer on the light-emitting layer and the wiring, continuous over the light-emitting layer and the wiring and containing a fluoride of a first metal which is an alkali metal (Continued)

or an alkaline earth metal; an organic functional layer on the intermediate layer, continuous over the light-emitting layer and the wiring and made of an organic material having an electron transporting property or an electron injection property and doped with a second metal having a property of cleaving a bond between the first metal and fluorine in the fluoride; and a cathode on the organic functional layer, continuous over the light-emitting layer and the wiring.

4 Claims, 9 Drawing Sheets

(51) Int. Cl.
 H01L 51/50 (2006.01)
 H01L 51/52 (2006.01)
 H01L 51/56 (2006.01)
(52) U.S. Cl.
 CPC ...... *H01L 51/5092* (2013.01); *H01L 51/5206* (2013.01); *H01L 51/5228* (2013.01); *H01L 51/5234* (2013.01); *H01L 51/56* (2013.01); H01L 27/3244 (2013.01); H01L 51/50 (2013.01); H01L 51/5218 (2013.01); H01L 2251/5315 (2013.01)

(56) References Cited

U.S. PATENT DOCUMENTS

| | | |
|---|---|---|
| 2004/0056591 A1 | 3/2004 | Koo et al. |
| 2004/0124766 A1* | 7/2004 | Nakagawa .......... H01L 51/0064 313/504 |
| 2004/0222737 A1* | 11/2004 | Raychaudhuri ..... H01L 51/5092 313/504 |
| 2006/0019573 A1 | 1/2006 | Koo et al. |
| 2006/0220534 A1 | 10/2006 | Shibanuma et al. |
| 2007/0210705 A1 | 9/2007 | Yokoi et al. |
| 2010/0084646 A1* | 4/2010 | Matsusue .......... H01L 51/5203 257/40 |
| 2012/0146062 A1* | 6/2012 | Oda ................... H01L 27/3211 257/88 |
| 2013/0328024 A1 | 12/2013 | Mizusaki et al. |
| 2015/0008414 A1 | 1/2015 | Isobe |
| 2015/0060837 A1 | 3/2015 | Shibanuma et al. |
| 2016/0141539 A1 | 5/2016 | Hoang et al. |
| 2016/0172620 A1 | 6/2016 | Hashimoto et al. |
| 2016/0226014 A1 | 8/2016 | Yoneda et al. |

FOREIGN PATENT DOCUMENTS

| | | |
|---|---|---|
| JP | 2006-287078 | 10/2006 |
| JP | 2007-317378 | 12/2007 |
| WO | 2009/110186 | 9/2009 |
| WO | 2013/031076 | 3/2013 |
| WO | 2013/118462 | 8/2013 |
| WO | 2015/037237 | 3/2015 |

* cited by examiner

FIG. 3

| Sample number | Ref | 1 | 2 | 3 | 4 | 5 | 6 | 7 | 8 | 9 |
|---|---|---|---|---|---|---|---|---|---|---|
| Ba concentration in organic functional layer [wt%] | | 40 | 40 | 40 | 40 | 20 | 20 | 5 | 5 | 5 |
| Film thickness of Ba layer [nm] | 1 | | | | | | | | | |
| Film thickness of intermediate layer [nm] | 2 | 1 | 2 | 4 | 1 | 2 | 4 | 1 | 2 | 4 |
| Contact resistance [Ω] | $1.86 \times 10^5$ | $8.84 \times 10^4$ | $4.77 \times 10^5$ | $6.86 \times 10^5$ | $4.77 \times 10^5$ | Greater than measurement limit ($>3 \times 10^6$) | | | | |

(Row: No Ba Layer spans samples 5–9)

ORGANIC LIGHT-EMITTING DEVICE HAVING A FLUORIDE AND METAL BASED INTERMEDIATE LAYER AND PRODUCTION METHOD

TECHNICAL FIELD

The present invention relates to an organic light-emitting device that includes a light-emitting layer containing an organic light-emitting material and interposed between an anode and a cathode, and a production method of such an organic light-emitting device.

BACKGROUND ART

In recent years, development of organic light-emitting devices such as organic electroluminescence (EL) display panels and organic EL lighting devices has flourished. For example, an organic light-emitting device includes a thin film transistor (TFT) substrate, an anode, a light-emitting layer, and a cathode. An organic EL element further includes, as necessary, a hole injection layer, a hole transport layer, an electron injection layer, an electron transport layer, a sealing layer, and the like. An organic EL display panel includes a plurality of subpixels that are arranged two-dimensionally along a main surface of a substrate. Each subpixel has a structure in which an anode, a hole injection layer, a hole transport layer, an organic light-emitting layer, an electron transport layer, and a cathode are stacked in this order on the substrate.

In some active matrix driven organic EL display panels, a plurality of independent electrodes corresponding one-to-one to a plurality of pixels are formed as anodes, and a common electrode that is continuous over the plurality of pixels is formed as a cathode. When the cathode is continuous over a plurality of pixels as described above, voltages are applied from a peripheral portion of the cathode. As a result, a central portion of the cathode receives a lower voltage than a voltage that portions closer to the peripheral portion receive, due to electrical resistance of the cathode itself. Further, in such an organic EL display panel, the distance from the peripheral portion of the common electrode to one pixel differs from the distance from the peripheral portion of the common electrode to another pixel. Due to this structure, voltage between the cathode and the anode in one pixel differs from voltage between the cathode and the anode in another pixel. This results in unevenness of luminance of the organic EL display panel. Such voltage differences are especially salient in large-size organic EL display panels.

In response to this, Patent Literature 1 discloses a technology for reducing differences in voltage between pixels by disposing wiring on the substrate and electrically connecting the wiring and the upper electrode. In many cases, such an electrical connection is achieved by putting the wiring and the cathode in direct contact.

Further, research and development are being carried out on a layer of an organic material doped with an alkali metal and an alkaline earth metal, which have a low work function, as an electron transport layer. It is known that an excellent electron injection property can be achieved by adopting such an electron transport layer.

Alkali metals and alkaline earth metals, which have a low work function, have a characteristic of easily reacting to impurities such as moisture and oxygen. This characteristic is likely to cause degradation of functional layers that contain an alkali metal or an alkaline earth metal when such impurities are existent. Due to this, an organic EL element including such a functional layer suffers an adverse effect such as degradation of light emission efficiency, shortening of light-emitting lifetime, and degradation of storage stability. Also, contact between impurities and a cathode made of a metal causes corrosion and degradation of the cathode, and an organic EL element including such a cathode can suffer the same adverse effects as described above. Specifically, when a light-emitting layer, a hole injection layer, a hole transport layer, a bank and the like are formed through a wet process, impurities (moisture, oxygen) may remain on surfaces of these layers or within these layers. These impurities can cause degradation of the metal forming the cathode and the alkali metal or the alkaline earth metal in the functional layer.

In response to this, Patent Literature 2 discloses a technology of interposing an intermediate layer made of a fluoride of an alkali metal or a fluoride of an alkaline earth metal between a light-emitting layer and an organic functional layer.

CITATION LIST

Patent Literature

Patent Literature 1

Japanese Patent Application Publication No. 2004-111369

Patent Literature 2

Japanese Patent Application Publication No. 2007-317378

SUMMARY OF INVENTION

Technical Problem

In some organic EL display panels, a layer disposed above a light-emitting layer is formed as a layer that is continuous over a plurality of pixels in order to simplify production processes, because such a layer does not have to be provided individually for each pixel.

Here, a fluoride of an alkali metal and a fluoride of an alkaline earth metal have a great electrical resistivity. When an intermediate layer made of a fluoride of an alkali metal or a fluoride of an alkaline earth metal is continuous over a plurality of pixels, the intermediate layer is interposed between wiring and a portion of a cathode facing the wiring, and electrical resistance between the wiring and the portion of the cathode facing the wiring (hereinafter referred to as "contact resistance") is likely to be great. As a result, it becomes difficult to reduce differences in voltage applied to different ones of the pixels.

The present invention has been achieved in view of the above problems, and an aim thereof is to provide an organic light-emitting device having reduced contact resistance and having an intermediate layer made of a fluoride of an alkali metal or a fluoride of an alkaline earth metal interposed between wiring and a cathode, and a production method of such an organic light-emitting device.

Solution to Problem

In order to achieve the above-stated aim, an organic light-emitting device pertaining to one aspect of the present invention is characterized by including: a substrate; an anode disposed above the substrate; wiring disposed above the substrate, the wiring being spaced away from the anode in a direction parallel to a main surface of the substrate; a light-emitting layer disposed above the anode and containing an organic light-emitting material; an intermediate layer disposed on the light-emitting layer and the wiring, the intermediate layer being continuous over the light-emitting layer and the wiring and containing a fluoride of a first metal, the first metal being an alkali metal or an alkaline earth metal; an organic functional layer disposed on the intermediate layer, the organic functional layer being continuous over the light-emitting layer and the wiring and made of an organic material doped with a second metal, the organic material having at least one of an electron transporting property and an electron injection property, the second metal having a property of cleaving a bond between the first metal and fluorine in the fluoride of the first metal; and a cathode disposed on the organic functional layer, the cathode being continuous over the light-emitting layer and the wiring. Further, the organic light-emitting device pertaining to one aspect of the present invention satisfies $1 \leq x \leq 2$, $20 \leq y \leq 40$, and $y \geq 20x$, where x denotes a film thickness [nm] of the intermediate layer and y denotes a dope concentration [wt %] of the second metal in the organic functional layer.

Advantageous Effects of Invention

In the organic light-emitting device pertaining to one aspect of the present invention, the film thickness x [nm] of the intermediate layer and the dope concentration y [wt %] of the second metal in the organic functional layer satisfy $1 \leq x \leq 2$, $20 \leq y \leq 40$, and $y \geq 20x$. Accordingly, electrical resistance between the wiring and the cathode is within a preferable range. Due to this structure, differences in voltages applied to different portions of the display surface or the light-emitting surface of the organic light-emitting device is reduced, and therefore reduction of unevenness of luminance of the organic light-emitting device is achieved.

BRIEF DESCRIPTION OF DRAWINGS

FIG. 3 illustrates results of a measurement of contact resistance between the wiring and a cathode of samples of organic EL display panels each having different organic functional layer Ba concentration and intermediate layer film thickness, along with structures of the samples used for the measurement.

FIG. 7A is a partial cross-sectional view illustrating a state in which a TFT layer has been formed on a base member. FIG. 7B is a partial cross-sectional view illustrating a state in which an interlayer electrically-insulating layer has been formed on the TFT layer. FIG. 7C is a partial cross-sectional view illustrating a state in which the anodes and the wiring have been formed on the interlayer electrically-insulating layer. FIG. 7D is a partial cross-sectional view illustrating a state in which hole injection layers have been formed on the anodes and the wiring.

FIG. 8A is a partial cross-sectional view illustrating a state in which a bank material layer has been formed on the hole injection layers and the interlayer electrically-insulating layer. FIG. 7B is a partial cross-sectional view illustrating a state in which a bank layer has been formed on the hole injection layers and the interlayer electrically-insulating layer. FIG. 7C is a partial cross-sectional view illustrating a state in which hole transport layers and light-emitting layers have been formed within openings in the bank layer.

FIG. 9A is a partial cross-sectional view illustrating a state in which an intermediate layer has been formed on the bank layer, on the light-emitting layers, and above the wiring. FIG. 9B is a partial cross-sectional view illustrating a state in which an organic functional layer has been formed on the intermediate layer. FIG. 9C is a partial cross-sectional view illustrating a state in which a cathode and a sealing layer have been formed on the organic functional layer.

DESCRIPTION OF EMBODIMENTS

<Overview of Aspect of Present Invention>

Figure 1:
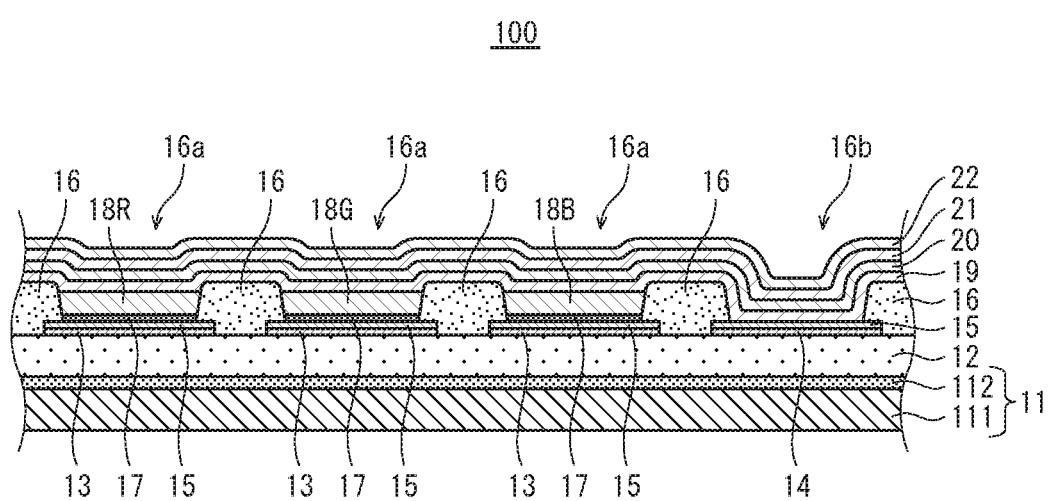
FIG. 1 is a partial cross-sectional view schematically illustrating a structure of an organic EL display panel which is one example of an organic EL device pertaining to an embodiment of the present invention.

An organic light-emitting device pertaining to one aspect of the present invention is characterized by including: a substrate; an anode disposed above the substrate; wiring disposed above the substrate, the wiring being spaced away from the anode in a direction parallel to a main surface of the substrate; a light-emitting layer disposed above the anode and containing an organic light-emitting material; an intermediate layer disposed on the light-emitting layer and the wiring, the intermediate layer being continuous over the light-emitting layer and the wiring and containing a fluoride of a first metal, the first metal being an alkali metal or an alkaline earth metal; an organic functional layer disposed on the intermediate layer, the organic functional layer being continuous over the light-emitting layer and the wiring and made of an organic material doped with a second metal, the organic material having at least one of an electron transporting property and an electron injection property, the second metal having a property of cleaving a bond between the first metal and fluorine in the fluoride of the first metal; and a cathode disposed on the organic functional layer, the cathode being continuous over the light-emitting layer and the wiring. Further, the organic light-emitting device pertaining to one aspect of the present invention satisfies $1 \leq x \leq 2$, $20 \leq y \leq 40$, and $y \geq 20x$, where x denotes a film thickness [nm] of the intermediate layer and y denotes a dope concentration [wt %] of the second metal in the organic functional layer.

According to this structure, electrical resistance between the wiring and the cathode is within a preferable range. Due to this structure, differences in voltages applied to different portions of the display surface or the light-emitting surface of the organic light-emitting device is reduced, and therefore reduction of unevenness of luminance of the organic light-emitting device is achieved.

Further, a specific example of the organic light-emitting device pertaining to one aspect of the present invention is characterized in that the first metal is sodium.

According to this structure, an excellent property of injecting electrons to the light-emitting layer is achieved.

Further, a specific example of the organic light-emitting device pertaining to one aspect of the present invention is characterized in that the second metal is barium.

According to this structure, the organic functional layer is made of barium, which is a versatile material, and therefore cost reduction is achieved.

Further, a specific example of the organic light-emitting device pertaining to one aspect of the present invention is characterized in that the anode and the wiring are made of the same material.

According to this structure, the anode and the wiring can be produced in a single production process by using the same material. As a result, work efficiency is improved due to a small number of production processes and cost reduction is achieved due to using the same material for the anode and the wiring.

Further, a specific example of the organic light-emitting device pertaining to one aspect of the present invention is characterized in that the anode is made of ITO or IZO.

According to this structure, light from the light-emitting layer can be efficiently emitted to the outside of the organic light-emitting device when the organic light-emitting device pertaining to the aspect of the present invention is applied to a display device of a bottom-emission type or a lighting device of a bottom-emission type.

Further, a specific example of the organic light-emitting device pertaining to one aspect of the present invention is characterized in that the cathode is made of a light-transmissive electrically conductive material.

According to this structure, light from the light-emitting layer can be efficiently emitted to the outside of the organic light-emitting device when the organic light-emitting device pertaining to the aspect of the present invention is applied to a display device of a top-emission-type or a lighting device of a top-emission type.

Further, a specific example of the organic light-emitting device pertaining to one aspect of the present invention is characterized in that the light-transmissive electrically conductive material is ITO.

According to this structure, ITO, which is a typical material in the field of organic EL devices, can be used. Accordingly, cost reduction is achieved.

A production method of an organic light-emitting device pertaining to another aspect of the present invention is characterized by including: forming an anode and wiring above a substrate, the wiring being spaced away from the anode in a direction parallel to a main surface of the substrate; forming a light-emitting layer containing an organic light-emitting material above the anode; forming an intermediate layer on the light-emitting layer and the wiring, the intermediate layer being continuous over the light-emitting layer and the wiring and containing a fluoride of a first metal, the first metal being an alkali metal or an alkaline earth metal; forming an organic functional layer on the intermediate layer, the organic functional layer being continuous over the light-emitting layer and the wiring and made of an organic material doped with a second metal, the organic material having at least one of an electron transporting property and an electron injection property, the second metal having a property of cleaving a bond between the first metal and fluorine in the fluoride of the first metal; and forming a cathode on the organic functional layer, the cathode being continuous over the light-emitting layer and the wiring. Further, the production method of an organic light-emitting device pertaining to another aspect of the present invention satisfies $1 \leq x \leq 2$, $20 \leq y \leq 40$, and $y \geq 20x$, where x denotes a film thickness [nm] of the intermediate layer and y denotes a dope concentration [wt %] of the second metal in the organic functional layer.

According to this method, electrical resistance between the wiring and the cathode is within a preferable range. Through this method, an organic light-emitting device in which differences in voltage applied to different portions of the display surface or the light-emitting surface is reduced, and therefore reduction of unevenness of luminance is achieved, can be produced.

Further, a specific example of the production method of an organic light-emitting device pertaining to another aspect of the present invention is characterized in that the first metal is sodium.

According to this method, an excellent property of injecting electrons to the light-emitting layer is achieved.

Further, a specific example of the production method of an organic light-emitting device pertaining to another aspect of the present invention is characterized in that the second metal is barium.

According to this method, the organic functional layer is made of barium, which is a versatile material, and therefore cost reduction is achieved.

The following explains structures, functions, and effects of an embodiment and modifications of the present invention with specific examples.

Note that the embodiment and modifications in the following explanation are mere examples for simply explaining the structures, functions, and effects pertaining to one aspect of the present invention. The present invention is not limited to the embodiment and the modifications except for parts considered essential to the present invention. Numerical value ranges indicated by the symbol "-" are numerical value ranges including the numerical values at both sides of the symbol.

Embodiment

[1. Process by which Embodiment of Present Invention was Achieved]

Both barium and sodium have a low work function and a high electron injection property. When using barium and sodium in organic EL devices for the purpose of improving a property of injecting electrons to a light-emitting layer, sodium can achieve a better electron injection property than barium can, due to the relationship between energy levels of barium and the light-emitting layer and energy levels of sodium and the light-emitting layer.

However, sodium is highly reactive, and even if an attempt to form a layer composed only of sodium is made, sodium easily reacts with oxygen, moisture or the like in the surroundings and become oxidized during the forming. This makes it extremely difficult to form a layer composed only of sodium.

The inventors thus have devised an intermediate layer in which a first intermediate layer made of sodium fluoride (NaF), which is relatively stable, and a second intermediate layer made of barium are stacked in this order. In this structure, barium in the second intermediate layer cleaves a bond between the sodium and the fluorine in the NaF in the first intermediate layer and causes the sodium to be liberated. The liberated sodium can promote injection of electrons to the light-emitting layer.

Here, because NaF is electrically insulative, electrical resistance of the first intermediate layer is high when the first intermediate layer is too thick. Further, when the second intermediate layer is too thick relative to the first intermediate layer, more NaF in the first intermediate layer than necessary is decomposed and the electron injection property becomes greater than necessary. As a result, the balance between the amount of holes supplied to the light-emitting layer and the amount of electrons supplied to the light-emitting layer is lost, causing the light-emitting efficiency to be low. As such, the balance between the amount of NaF in the first intermediate layer and the amount of Ba in the second intermediate layer is essential in the above structure.

Examinations by the inventors have revealed that an excellent light-emitting property can be achieved when the film thickness of the first intermediate layer (NaF) is 2 nm and the film thickness of the second intermediate layer (Ba) is 1 nm.

Meanwhile, the second intermediate layer is formed through vapor deposition. However, vapor deposition for forming the second intermediate layer needs to be performed at a slow speed, because the second intermediate layer has an extremely small film thickness of 1 nm. This is problematic because such a process requires a long time period and is hard to control. In addition, the small film thickness of the second intermediate layer makes it difficult to form the second intermediate layer in a uniform thickness, and portions where the Ba layer is formed and portions where the Ba layer is not formed are likely to form a mottled pattern.

From the above reasons, the inventors have arrived at the invention of a structure that can achieve reduced contact resistance without the Ba layer (the second intermediate layer).

[2. Structure of Organic EL Display Panel]

Figure 2:
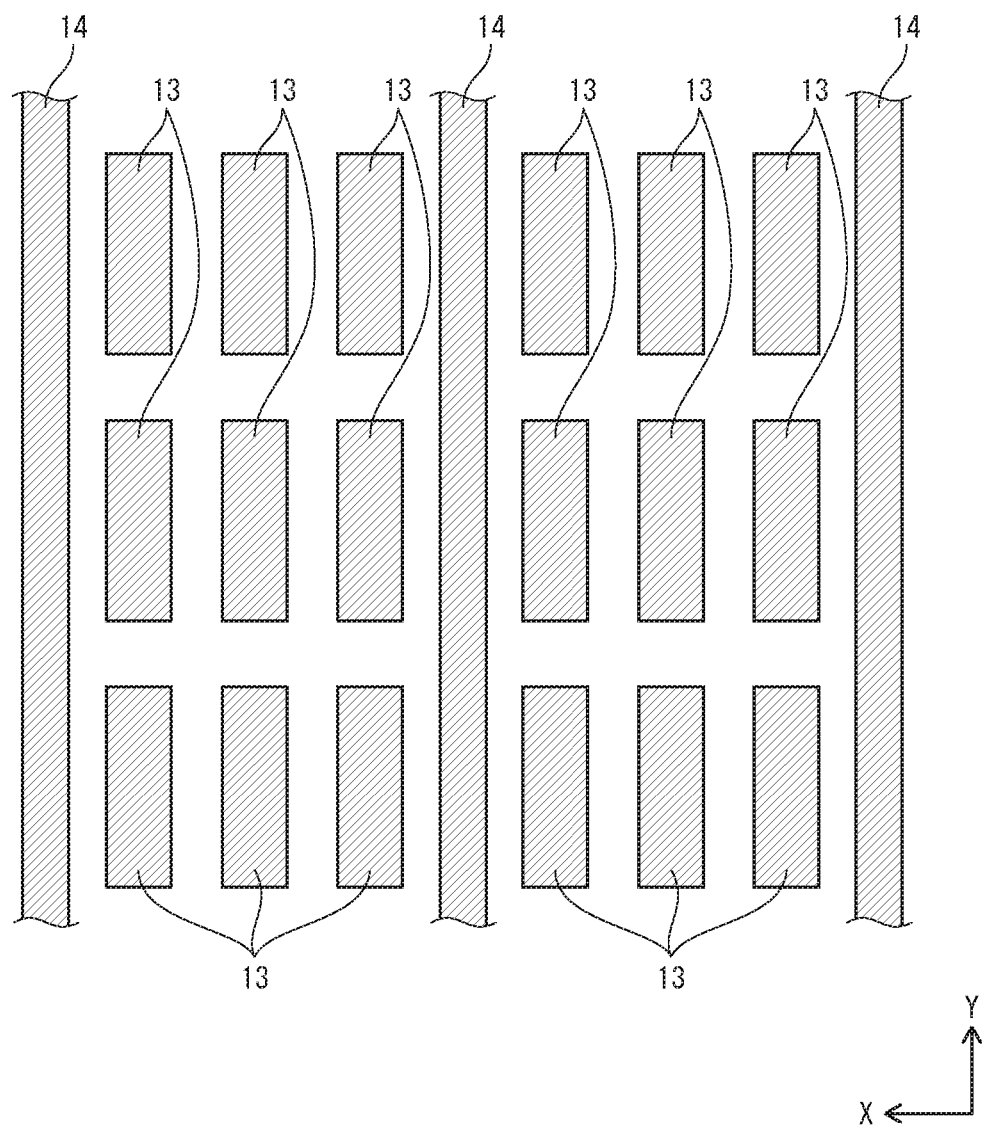
FIG. 2 is a top view illustrating a layout of anodes and wiring in the organic EL display panel illustrated in FIG. 1.

The following describes a structure of an organic EL panel pertaining to one embodiment as an example of an organic light-emitting device pertaining to one aspect of the present invention, with reference to FIG. 1 and FIG. 2.

FIG. 1 is a magnified cross-sectional view of a part of an organic EL display panel 100 pertaining to the embodiment. The organic EL display panel 100 includes a plurality of pixels that are arranged so as to form a matrix on a substrate 11. Each of the pixels is composed of three subpixels corresponding one-to-one to R (red), G (green), and B (blue). The organic EL display panel 100 is a so-called top-emission type that has a display surface situated in the upper side of FIG. 1.

The organic EL display panel 100 includes the substrate 11, an interlayer electrically-insulating layer 12, anodes 13, wiring 14, hole injection layers 15, a bank layer 16, hole transport layers 17, light-emitting layers 18R, 18G, 18B, an intermediate layer 19, an organic functional layer 20, a cathode 21, and a sealing layer 22. The substrate 11, the interlayer electrically-insulating layer 12, the intermediate layer 19, the organic functional layer 20, the cathode 21, and the sealing layer 22 each are continuous over the plurality of pixels.

The following describes structures of components of the organic EL display panel 100.

<Substrate>

The substrate 11 includes a thin film Transistor (TFT) layer 112 and a base member 111 which is made of an electrically insulating material. The TFT layer 112 includes drive circuits (not illustrated) corresponding one-to-one to the subpixels. For example, the base member 111 is made of a glass material. Specific examples of such glass materials usable for forming the base member 111 include alkali-free glass, soda glass, nonfluorescent glass, phosphate glass, borate glass, and quartz.

<Interlayer Electrically-Insulating Layer>

The interlayer electrically-insulating layer 12 is disposed on the substrate 11. The interlayer electrically-insulating layer 12 is made of a resin material, and flattens unevenness of an upper surface of the TFT layer 112. For example, the interlayer electrically-insulating layer 12 is made of a resin material such as a positive photosensitive material. Examples of such photosensitive materials usable for forming the interlayer electrically-insulating layer 12 include an acrylic resin, a polyimide resin, a siloxane resin, and a phenolic resin.

<Anodes>

The anodes 13 are made of an electrically conductive material and are disposed on the interlayer electrically-insulating layer 12. The anodes 13 correspond one-to-one to the subpixels. Because the organic EL display panel 100 pertaining to the present embodiment is a top-emission type organic EL display panel, it is preferable that the anodes 13 are made of an electrically conductive material with optical reflectivity. Specific examples of such electrically conductive materials with optical reflectivity usable for forming the anodes 13 include metals such as silver (Ag), aluminum (Al), an alloy containing Al, molybdenum (Mo), APC (an alloy of silver, palladium, and copper), ARA (an alloy of silver, rubidium, and gold), MoCr (an alloy of molybdenum and chromium), MoW (an alloy of molybdenum and tungsten), and NiCr (an alloy of nickel and chromium). The anodes 13 may be a stack of a layer of the above electrically conductive material with optical reflectivity and a layer of a light-transmissive electrically conductive material that are disposed on one another. Examples of such light-transmissive electrically conductive materials usable in such a structure include indium tin oxide (ITO), indium zinc oxide (IZO), and zinc oxide (ZnO).

Although not illustrated in this cross-sectional view, the interlayer electrically-insulating layer 12 has a contact hole for each subpixel. This contact hole has a TFT connection wiring embedded therein. The TFT connection wiring electrically connects one of the anodes 13 with a corresponding one of the drive circuits, which are formed on the TFT layer 112.

<Wiring>

The wiring 14 is spaced away from the anodes 13 in a direction parallel to a main surface of the substrate 11, on the interlayer electrically-insulating layer 12. The wiring 14 is made of an electrically conductive material such as a metal. Note that the wiring 14 may be formed as a stack of a plurality of layers that are each made of an electrically conductive material disposed on one another. Further, the wiring 14 may be made of the same material as the anodes 13. This structure makes production easy because the anodes 13 and the wiring 14 can be formed in a single production process.

The following describes shapes of the anodes 13 and the wiring 14 and relative positional relationships between the anodes 13 and the wiring 14. FIG. 2 illustrates a layout of the anodes 13 and the wiring 14 in plan view. As illustrated in FIG. 2, each of the anodes 13 has a rectangular shape in plan view, and the wiring 14 includes a plurality of portions each having a linear shape in plan view. The anodes 13 are arranged along an X-axis direction and a Y-axis direction so as to form a matrix. Three lines of the anodes 13 extending along the Y-axis direction are arranged between a pair of adjacent portions of the wiring 14. That is, a portion of the wiring 14 is provided for every set of three lines of the anodes 13 (lines along the Y-axis direction). Due to the arrangement of the wiring 14 described above, difference between voltages that the pixels receive is reduced irrespective of the distance of the pixels from the peripheral portion of the cathode 21.

<Hole Injection Layers>

The hole injection layers 15 promote injection of holes from the anodes 13 to the light-emitting layers 18. Accordingly, the hole injection layers 15 are disposed on the anodes 13 but are not necessarily disposed on the wiring 14. For example, the hole injection layers 15 are made of a metal oxide. For example, the hole injection layers 15 are formed through sputtering. Examples of such metal oxides usable for forming the hole injection layers 15 include tungsten oxide (WOx), molybdenum oxide (MoOx), and oxides of silver (Ag), chromium (Cr), vanadium (V), nickel (Ni), iridium (Ir), and the like. Also, the hole injection layers 15 may be made of an electrically conductive polymer material such as polyethylenedioxythiophene (PEDOT; mixture of polythiophene and polystyrene sulfonic acid) and polyaniline. In such a structure, the hole injection layers 15 are formed through a wet process. When the hole injection layers 15 are formed through a wet process, the bank layer 16 is necessary in the forming of the hole injection layers 15. Accordingly, the hole injection layers 15 are formed after forming the bank layer 16 and before forming the hole transport layers 17. Further, each hole injection layer 15 may be composed of a combination of a layer formed through a dry process such as sputtering and a layer formed through a wet process.

<Bank Layer>

The bank layer 16 is disposed on the hole injection layers 15 so as to expose partial regions of upper surfaces of the hole injection layers 15, which are disposed on the anodes 13 and the wiring 14, and to cover regions around the partial regions. The regions of the upper surfaces of the hole injection layers 15 that are not covered with the bank layer 16 (hereinafter referred to as "openings") correspond one-to-one to the subpixels. In other words, the bank layer 16 has openings 16a provided for respective ones of the subpixels.

For example, the bank layer 16 is made of an electrically insulating organic material (such as an acrylic resin, a polyimide resin, a novolac resin, and a phenolic resin). When the light-emitting layers 18 are formed through ink application, the bank layer 16 functions as a structure for preventing the applied ink from overflowing. When the light-emitting layers 18 are formed through vapor deposition, the bank layer 16 functions as a structure on which a vapor deposition mask is placed. In the present embodiment, the bank layer 16 is made of a resin material such as a positive photosensitive material. Specific examples of such photosensitive materials usable for forming the bank layer 16 include an acrylic resin, a polyimide resin, a siloxane resin, and a phenolic resin. In the present embodiment, a phenolic resin is used.

<Hole Transport Layers>

The hole transport layers 17 transport holes injected from the hole injection layers 15 to the light-emitting layers 18. Accordingly, the hole transport layers 17 are disposed on the hole injection layers 15 above the anodes 13, but are not necessarily disposed on the hole injection layer 15 above the wiring 14. The hole transport layers 17 are formed through application and drying of a solution of an organic material. Examples of such organic materials usable for forming the hole transport layers 17 include a high-molecular compound such as polyfluorene, a polyfluorene derivative, polyallylamine, and a polyallylamine derivative. Further, the hole transport layers 17 may be made of a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and a styrylamine compound, a butadiene compound, a polystyrene derivative, a triphenylmethane derivative, or a tetraphenylbenzene derivative. Preferably, the hole transport layers 17 may be made of, specifically, a porphyrin compound, an aromatic tertiary amine compound, a styrylamine compound, and the like. In such a structure, the hole transport layers 17 are formed through vacuum vapor deposition.

<Light-Emitting Layers>

The light-emitting layers 18 contain an organic light-emitting material, and are formed within the openings 16a above the anodes 13. Each of the light-emitting layers 18 emits light of one of R, G, and B, due to recombination of holes and electrons. In FIG. 1, one of the letters R, G, and B is annexed to each of the light-emitting layers 18, so as to indicate the color that each of the light-emitting layers emits. However, whenever it is unnecessary to distinguish the light-emitting layers 18R, the light-emitting layers 18G, and the light-emitting layers 18B from one another, these layers are simply referred to as "the light-emitting layers 18".

Examples of such organic light-emitting materials usable for forming the light-emitting layers 18 include a fluorescent material such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group III metal, a metal complex of oxine, or a rare earth metal complex. Further, the light-emitting layers 18 may be made of a known phosphor substance, one example of which is a metal complex emitting phosphor light, such as tris(2-phenylpyridine) iridium. Also, the light-emitting layers 18 may be made of a high-molecular compound such as polyfluorene and a polyfluorene derivative, polyphenylene and a polyphenylene derivative, and polyallylamine and a polyallylamine derivative, and a mixture of one or more of the above low-molecular compounds usable for forming the light-emitting layers 18 and one or more of the above high-molecular compounds usable for forming the light-emitting layers 18.

<Intermediate Layer>

The intermediate layer 19 is disposed on the light-emitting layers 18, the bank layer 16, and the hole injection layers 15 which are formed above the wiring 14. The intermediate layer 19 is continuous over the plurality of pixels. The intermediate layer 19 prevents impurities that exist on surfaces of or within the light-emitting layers 18, the hole transport layers 17, the hole injection layers 15, and the bank layer 16 from intruding into the organic functional layer 20 and the cathode 21. Accordingly, the intermediate layer 19 contains a material with a property of blocking impurities. Examples of such materials with a property of blocking impurities, which are usable for forming the intermediate layer 19, include a fluoride of an alkali metal or a fluoride of an alkaline earth metal, such as sodium fluoride (NaF), lithium fluoride (LiF), and cesium fluoride (CsF). In the present embodiment, NaF is used. The alkali metal in the fluoride of such an alkali metal and the alkaline earth metal in the fluoride of such an alkaline earth metal in the intermediate layer 19 are hereinafter referred to as a first metal. In the present embodiment, sodium (Na) is included as a first metal.

<Organic Functional Layer>

The organic functional layer 20 is disposed on the intermediate layer 19 and is continuous over the plurality of pixels. That is, the organic functional layer 20 exists above the wiring 14. The organic functional layer 20 has a function as an electron transport layer that transports electrons injected from the cathode 21 to the light-emitting layers 18 and/or a function of promoting injection of electrons from the cathode 21 to the light-emitting layers 18. For example, the organic functional layer 20 is formed by doping an organic material which has at least one of an electron transporting property and an electron injection property with a metal. Specific examples of such organic materials usable for forming the organic functional layer 20 include a π-electron low-molecular organic material such as an oxadiazole derivative (OXD), a triazole derivative (TAZ), and a phenanthroline derivative (BCP, Bphen). The metal with which the organic material is doped (hereinafter referred to as a "second metal") has a function of cleaving the bond between the first metal and fluorine in the fluoride of the first metal contained in the intermediate layer 19. Examples of such metals usable as the second metal include an alkali metal and an alkaline earth metal. More specifically, a metal with a low work function such as barium, lithium (Li), calcium (Ca), potassium (K), cesium (Cs), sodium, rubidium (Rb), a metal salt with a low work function such as lithium fluoride, a metal oxide with a low work function such as barium oxide, or a metal organic complex with a low work function such as lithium quinolinol is used as the second metal. Specifically, the second metal in the present embodiment is barium (Ba).

<Cathode>

The cathode 21 is disposed on the organic functional layer 20 and is continuous over the plurality of pixels. For example, the cathode 21 is made of a light-transmissive electrically conductive material. Forming the cathode 21 by using a light-transmissive electrically conductive material enables light generated in the light-emitting layers 18 to be emitted to the outside of the organic light-emitting device 100 from a side of the cathode 21. Examples of such light-transmissive electrically conductive materials usable for the cathode 21 include ITO and IZO. Alternatively, the cathode 21 can be made of magnesium silver (MgAg), for example. In such a structure, light can pass through the cathode 21 by providing the cathode 21 with a thickness around several ten nanometers.

<Sealing Layer>

The sealing layer 22 is disposed on the cathode 21. The sealing layer 22 prevents intrusion of impurities (moisture, oxygen) from a side of the organic EL display panel 100 opposite the substrate 11 into the cathode 21, the organic functional layer 20, the light-emitting layers 18, and the like. Examples of a material for forming the sealing layer 22 include optically transmissive materials such as silicon nitride (SiN) and silicon oxynitride (SiON).

<Other Issues>

Although not illustrated in FIG. 1, color filters and/or an upper substrate may be mounted and adhered onto the sealing layer 22. Mounting and adhering an upper substrate further protects the cathode 21, the organic functional layer 20, the intermediate layer 19, the light-emitting layers 18, and the like from impurities.

[3. Contact Resistance]

There are two major measures that are possible in order to achieve reduced contact resistance without a Ba layer. One measure is to provide a reduced amount of NaF, which is electrically insulative; that is, to provide the intermediate layer 19 with a small film thickness. Another measure is to include a great amount of Ba in the organic functional layer 20 as a dopant to enhance the function of the organic functional layer 20 of cleaving Na and fluorine in NaF in the intermediate layer 19, instead of Ba layers.

Nine samples were prepared by changing the film thickness of the intermediate layer 19 (that is, an amount of NaF) and the Ba concentration in the organic functional layer 20. Measurement of a contact resistance value between the wiring 14 and the cathode 21 was conducted for each of the samples. Further, a sample including a Ba layer (corresponding to the second intermediate layer) with a thickness of 1 nm was prepared as a comparative example, and a contact resistance value was measured.

Structures of these samples and the results of the measurement of contact resistance are illustrated in the table in FIG. 3. For each of Comparative Example, Sample 2, and Sample 4, an average value of contact resistance values measured at three different positions is shown in FIG. 3. For each of Sample 1 and Sample 3, an average value of contact resistance values measured at two different positions is shown in FIG. 3.

As illustrated in FIG. 3, only Comparative Example (Ref) included a Ba layer, and Samples 1-9 did not include Ba layers. The Ba concentration in the organic functional layer 20 (hereinafter simply referred to as "Ba concentration") was 40 wt % in Samples 1-3; 20 wt % in Samples 4-6; and 5 wt % in Samples 7-9. The film thickness of the intermediate layer 19 was 1 nm in Samples 1, 4, 7; 2 nm in Samples 2, 5, 8; and 4 nm in Samples 3, 6, 9. The Ba concentration in Comparative Example was 40 wt %, and the film thickness of the intermediate layer 19 in Comparative Example was 2 nm.

Meanwhile, contact resistance values for Samples 5-9 could not be measured because the contact resistance values were greater than the measurement limit of the measuring instrument.

(3-1. Relationship Between Contact Resistance and Existence and Non-Existence of Ba Layer and Relationship Between Contact Resistance and Film Thickness of Intermediate Layer)

First, consideration is made with regard to how contact resistance changes when the Ba layer is simply not provided and how contact resistance changes in accordance with the film thickness of the intermediate layer 19.

Figure 4:
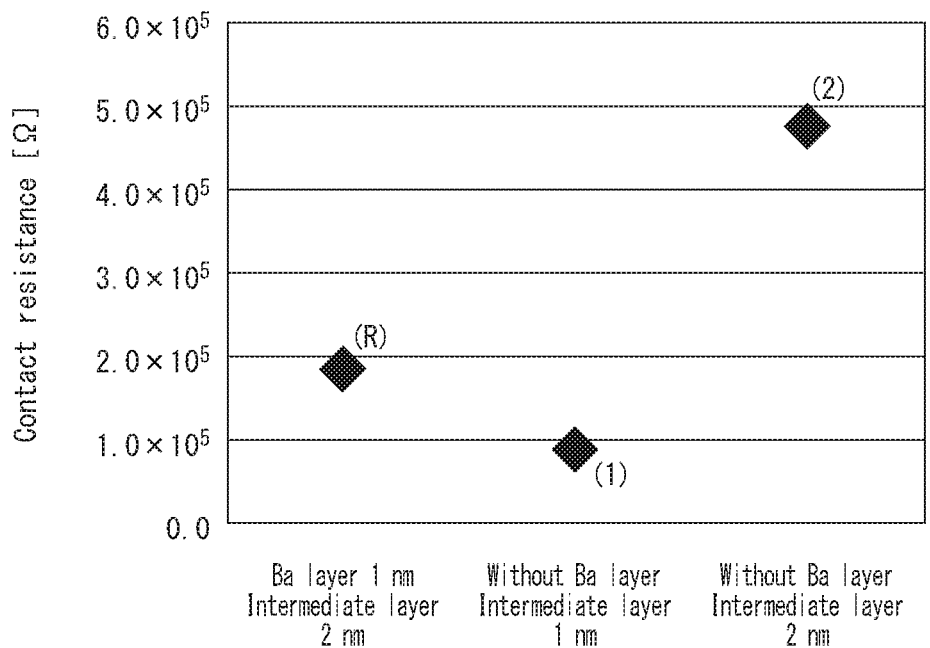
FIG. 4 is a graph obtained by plotting the results of the measurement of contact resistance for Sample 1, Sample 2, and Comparative Example, which are illustrated in FIG. 3.

FIG. 4 is a graph obtained by plotting the results of measurement of contact resistance for Comparative Example, Sample 1, and Sample 2. The Ba concentration was 40 wt % in all of Comparative Example, Sample 1, and Sample 2. Numbers in parentheses in FIG. 4 indicate sample numbers, and (R) indicates Comparative Example.

The film thickness of the intermediate layer 19 was 2 nm in both Comparative Example and Sample 2. Comparative example and Sample 2 differed from each other in that Sample 1 did not include a Ba layer while Comparative Example included a Ba layer. While the contact resistance for Comparative Example was $1.86 \times 10^5 [\Omega]$, the contact resistance for Sample 2 was $4.77 \times 10^5$. Thus, contact resistance was greater without a Ba layer.

The following compares Sample 1 and Sample 2. While the film thickness of the intermediate layer 19 in Sample 1 was 1 nm, the film thickness of the intermediate layer 19 in Sample 2 was 2 nm. While the contact resistance value for Sample 1 was $8.84 \times 10^4 [\Omega]$, the contact resistance value for Sample 2 was $4.77 \times 10^5 [\Omega]$. These results indicate that reduced contact resistance can be achieved by providing the intermediate layer 19 with a small film thickness, even without a Ba layer.

(3-2. Relationship Between Contact Resistance and Film Thickness of Intermediate Layer and Relationship Between Contact Resistance and Ba Concentration in Organic Functional Layer)

Figure 5:
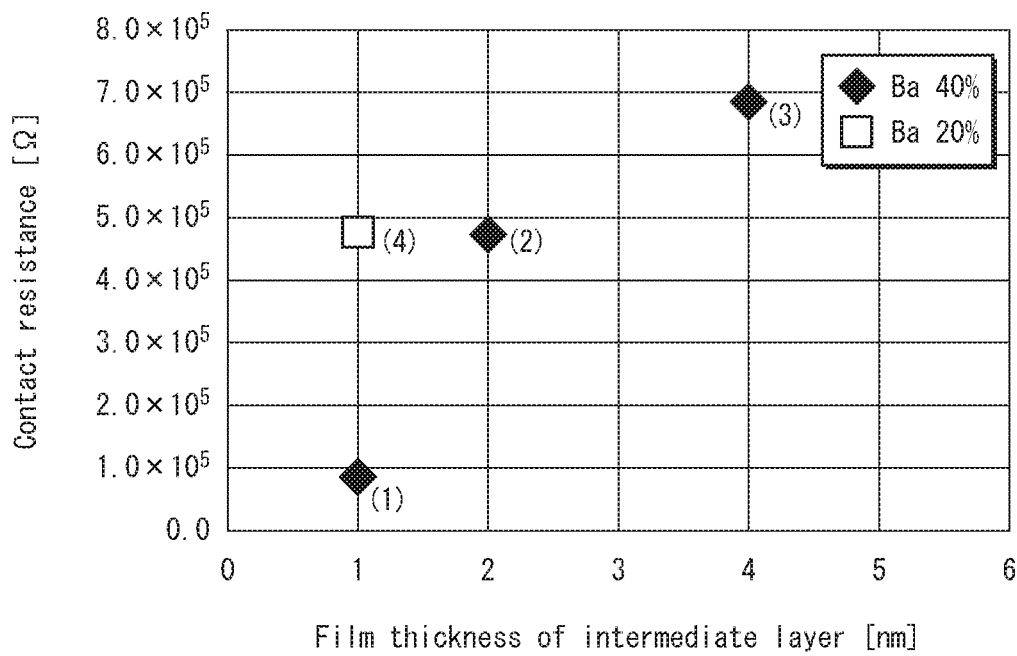
FIG. 5 is a graph obtained by plotting the results of the measurement of contact resistance illustrated in FIG. 3 on the basis of intermediate layer film thickness and organic functional layer Ba concentration.

FIG. 5 is a graph in which, for each of Samples 1-4, the contact resistance value is plotted along a vertical axis and the film thickness of the intermediate layer 19 is plotted along a horizontal axis. Samples 5-9, for which contact resistance values could not be measured, and Comparative Example are not illustrated in the graph.

In FIG. 5, the outlined square indicates a sample in which the Ba concentration was 20 wt % (Sample 4), and the black diamonds indicate samples in which the Ba concentration was 40 wt % (Samples 1-3). Numbers in parentheses in the figure indicate sample numbers.

As illustrated in FIG. 5, in the sample in which the Ba concentration was 20 wt %, the thinner the film thickness of the intermediate layer 19 was, the lower the contact resistance value was. Likewise, in the samples in which the Ba concentration was 40 wt %, the thinner the film thickness of the intermediate layer 19 was, the lower the contact resistance value was. This decrease of the contact resistance seemingly owes to small thickness of the intermediate layer 19 being made of NaF, which is electrically insulative, and thus having a lower electrical resistance.

Among the samples in which the Ba concentration was 20 wt %, a contact resistance value was obtained for only Sample 4, in which the film thickness of the intermediate layer 19 was 1 nm. However, the contact resistance values for Sample 5 and Sample 6 (in which the film thickness of the intermediate layer 19 was 2 nm and 4 nm, respectively) were greater than the measurement limit, and thus the contact resistance values for these samples were certainly higher than the contact resistance value for Sample 4. Accordingly, it seems that in the samples in which the Ba concentration was 20 wt %, in a manner similar to the samples in which Ba concentration was 40 wt %, the contact resistance of the intermediate layer 19 was lower when the film thickness of the intermediate layer 19 was thinner.

Next, differences in contact resistance caused by differences in a Ba concentration are considered. Comparison of Sample 1 and Sample 4, in both of which the film thickness of the intermediate layer 19 was 1 nm, reveals that the contact resistance value for Sample 1, in which the Ba concentration was 40 wt %, was lower than the contact resistance value for Sample 4, in which the Ba concentration was 20 wt %. Meanwhile, the contact resistance was greater than the measurement limit for Sample 5 and Sample 6, in both of which the Ba concentration was 20 wt %. This seemingly indicates the following: when comparing Sample 2 and Sample 5, in both of which the film thickness of the intermediate layer 19 was 2 nm, the contact resistance for Sample 5, in which the Ba concentration was 20 wt %, was higher than the contact resistance for Sample 2, in which the Ba concentration was 40 wt %; likewise, when comparing Sample 3 and 6, in both of which the film thickness of the intermediate layer 19 was 4 nm, the contact resistance for Sample 6, in which the Ba concentration was 20 wt %, was higher than the contact resistance for Sample 3, in which the Ba concentration was 40 wt %. Accordingly, the contact resistance value was lower for the samples in which the Ba concentration was 40 wt % (Sample 2 and Sample 3) than for the samples in which the Ba concentration was 20 wt % (Sample 5 and Sample 6).

The above results indicate that reduced contact resistance can be achieved by providing the intermediate layer 19 with a small film thickness and providing the organic functional layer 20 including Ba as the dopant in a high concentration, even without a Ba layer.

(3-3. Relationship Between Contact Resistance and Film Thickness of Intermediate Layer and Relationship Between Contact Resistance and Ba Concentration in Organic Functional Layer)

Here, an organic light-emitting device in which the contact resistance value is $5.0 \times 10^5$ or less is judged as being suitable for practical use. In FIG. 5, the contact resistance values for Samples 1, 2, and 4 are $5.0 \times 10^5$ or less. Accordingly, these three samples were judged as being suitable for practical use (Satisfactory), and the samples other than Samples 1, 2, and 4 were judged as not being suitable for practical use (Unsatisfactory).

Figure 6:
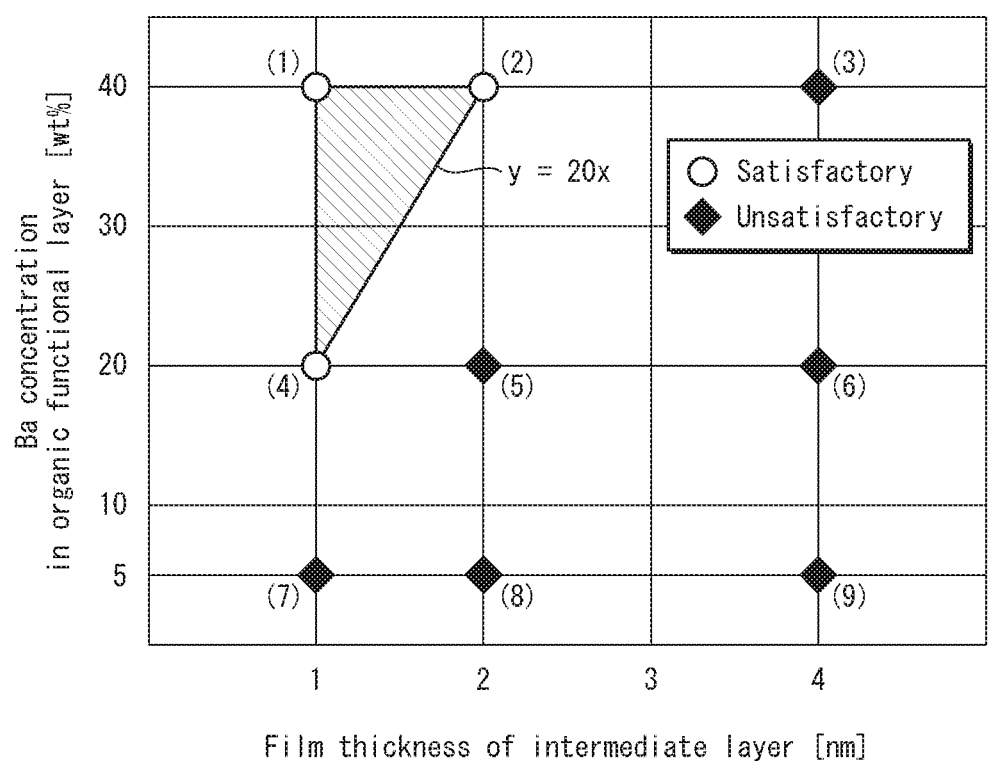
FIG. 6 is a graph obtained by plotting results of judgment of practicality of contact resistance on the basis of intermediate layer film thickness and organic functional layer Ba concentration.

FIG. 6 is a graph obtained by plotting the above judgment results so that the Ba concentration [wt %] in the organic functional layer 20 is plotted along the vertical axis (y-axis) and the film thickness [nm] of the intermediate layer 19 is plotted along the horizontal axis (x-axis).

In FIG. 6, outlined circles indicate samples whose contact resistance values were judged as being suitable for practical use (Satisfactory), and black diamonds indicate samples whose contact resistance values were judged as not being suitable for practical use (Unsatisfactory). Numbers in parentheses in the figure indicate sample numbers.

As illustrated in FIG. 6, the samples whose contact resistance was judged as being suitable for practical use are Samples 1, 2, and 4. Accordingly, samples plotted in a region surrounded by segments connecting Samples 1, 2, and 4 (the region hatched with oblique lines in FIG. 6) are considered as having a contact resistance value suitable for practical use.

Here, the straight line connecting Sample 2 and Sample 4 is expressed by $y=20x$. Accordingly, the region described above is a region that satisfies $1 \leq x \leq 2$, $20 \leq y \leq 40$, and $y \geq 20x$ in a graph in which a Ba concentration [wt %] in the organic functional layers 20 is plotted along the y-axis and a film thickness [nm] of the intermediate layer 19 is plotted along the x-axis. This region is hereinafter referred to as the "practicality region".

[4. Production Method of Organic EL Display Panel]

Figure 8A:
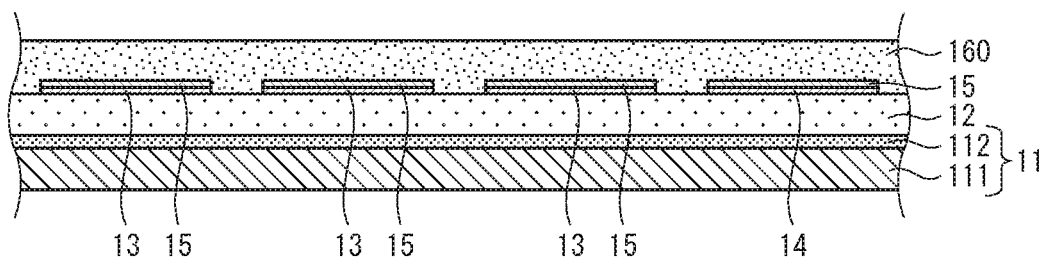
FIGS. 8A, 8B, and 8C are partial cross-sectional views each schematically illustrating a production process of the organic EL display panel, continuing from FIGS. 7A-7D.
Figure 8B:
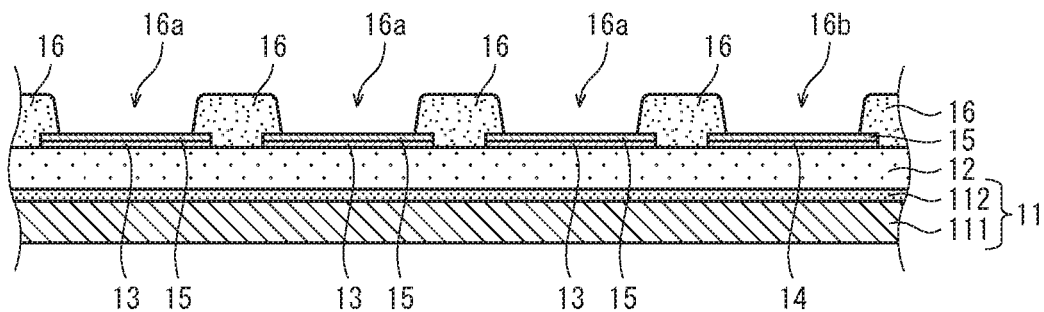
Figure 8C:
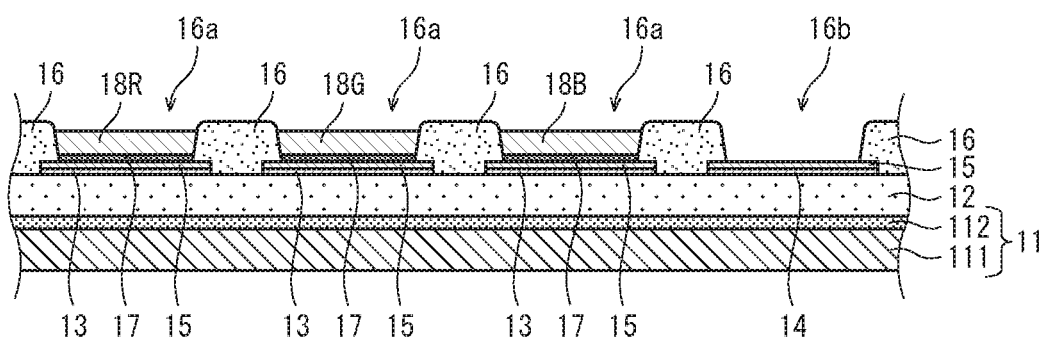
Figure 9A:
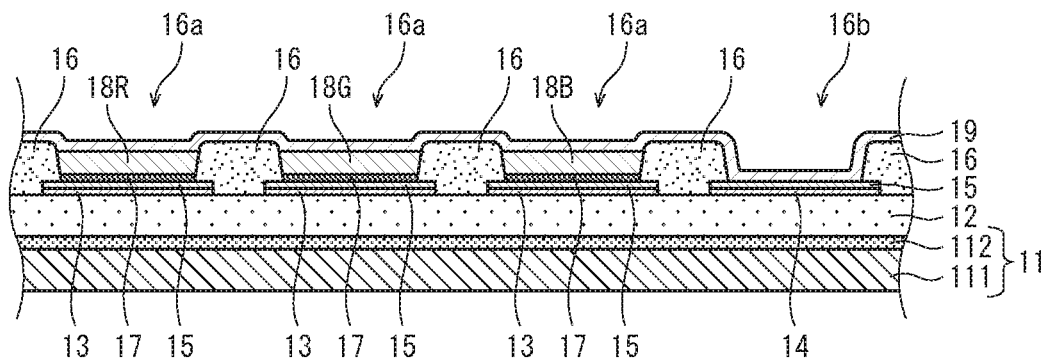
FIGS. 9A, 9B, and 9C are partial cross-sectional views each schematically illustrating a production process of the organic EL display panel, continuing from FIGS. 8A-8C.
Figure 9B:
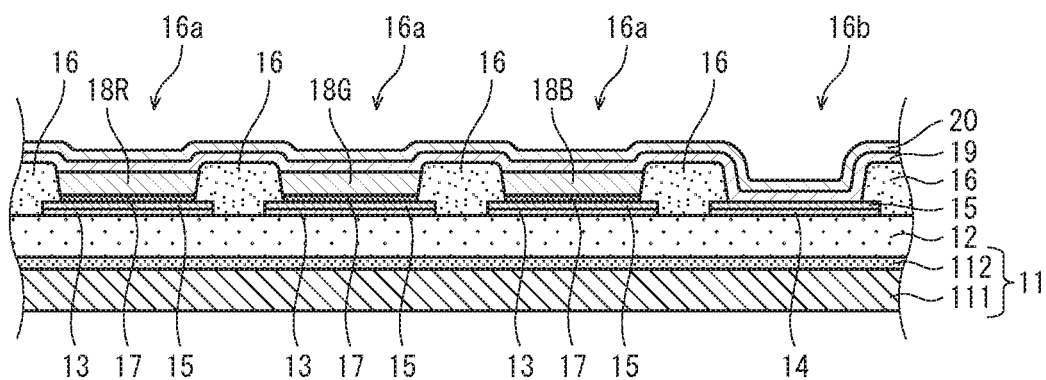
Figure 9C:
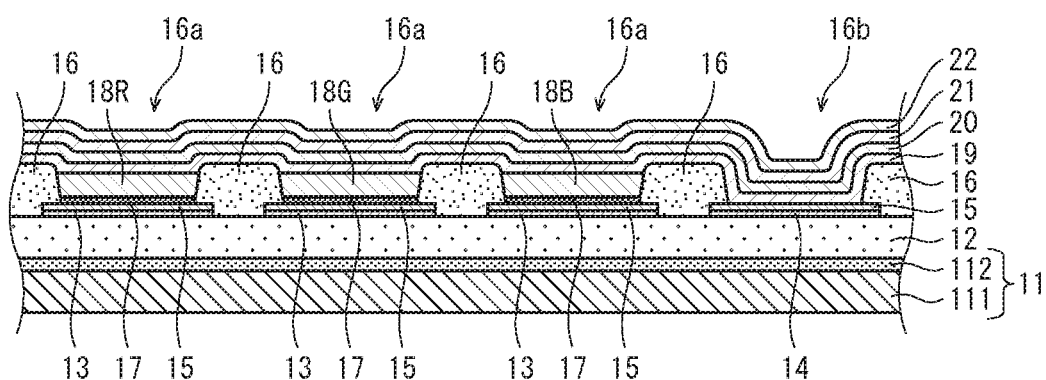
Figure 10:
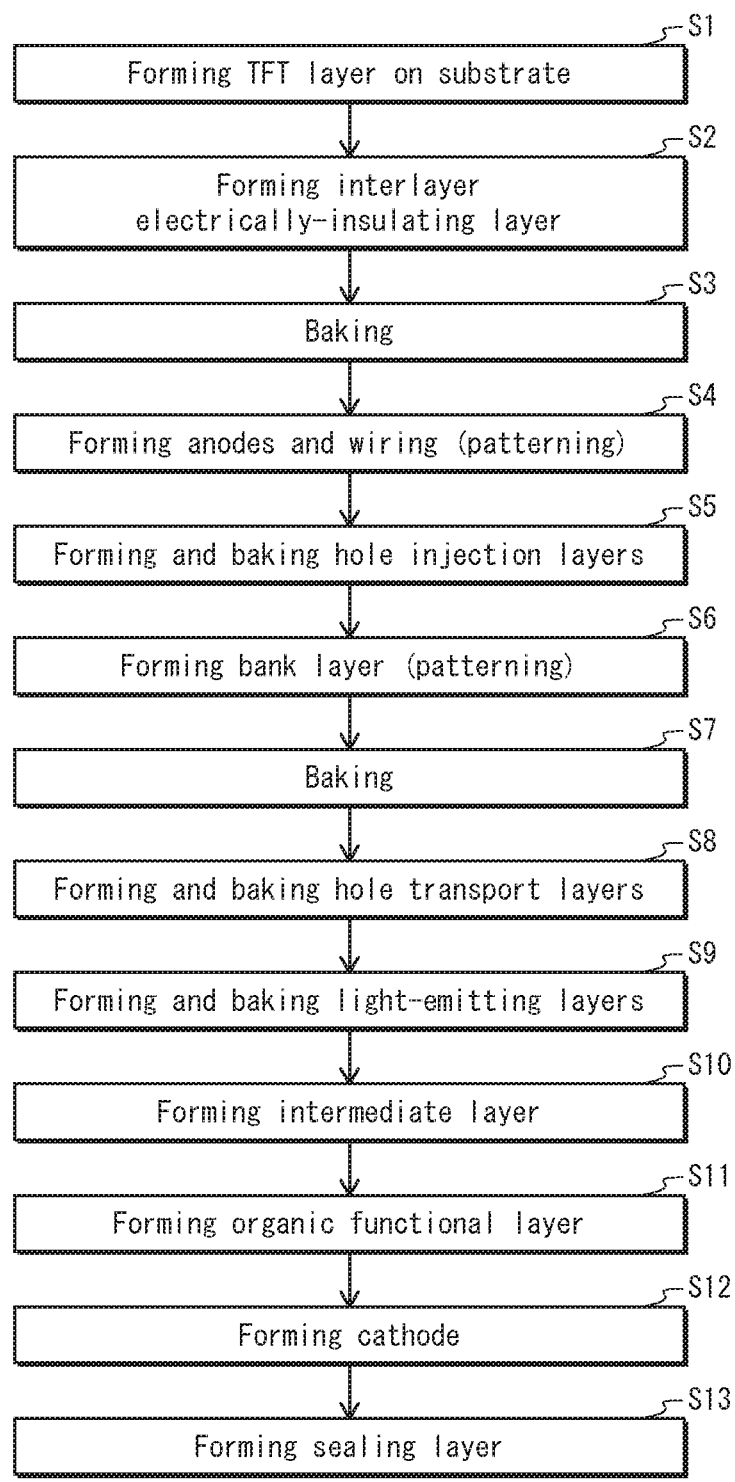
FIG. 10 schematically illustrates production processes of the organic EL display panel illustrated in FIG. 1.

The following describes an example of a production method of the organic EL display panel 100, with reference to FIGS. 7A-7D, FIGS. 8A-8C, FIGS. 9A-9C, and FIG. 10. FIGS. 7A-7D, FIGS. 8A-8C, and FIG. 9A-9C are partial cross-sectional views each schematically illustrating a production process of the organic EL display panel 100, and FIG. 10 schematically illustrates production processes of the organic EL display panel 100.

Figure 7A:
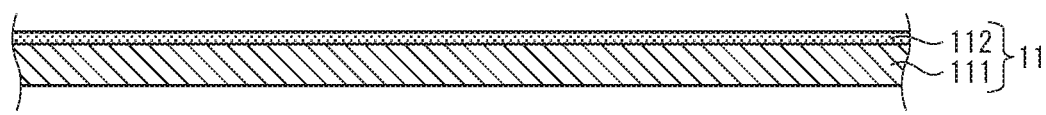
FIGS. 7A, 7B, 7C, and 7D are partial cross-sectional views each schematically illustrating a production process of the organic EL display panel illustrated in FIG. 1.

First, the substrate 11 is produced by forming the TFT layer 112 on the base member 111, as illustrated in FIG. 7A (step S1 in FIG. 10).

Figure 7B:
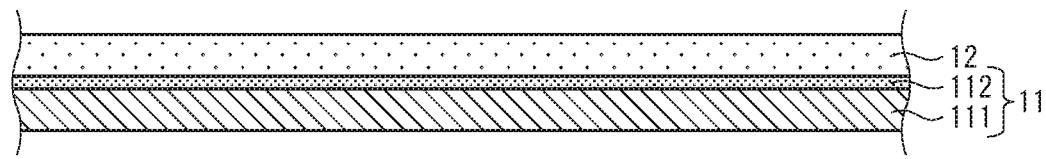

Next, the interlayer electrically-insulating layer 12 is formed on the substrate 11, as illustrated in FIG. 7B (step S2 in FIG. 10). In the present embodiment, the resin material used for forming the interlayer electrically-insulating layer 12 is an acrylic resin, which is a positive photosensitive material. The interlayer electrically-insulating layer 12 is formed by applying a solution for forming the interlayer electrically-insulating layer 12 on the substrate 11 and subsequently performing baking (step S3 in FIG. 10). The solution described above is obtained by dissolving the acrylic resin in a solvent (for example, PGMEA). For example, the baking is performed for 180 minutes at a temperature no lower than 150° C. and no higher than 210° C.

Figure 7C:
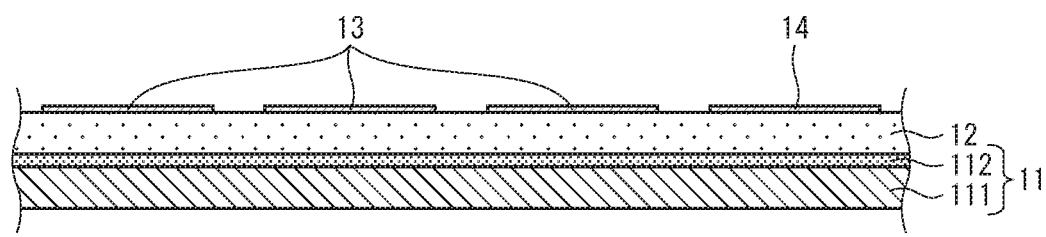

Next, the anodes 13 and the wiring 14 are formed on the interlayer electrically-insulating layer 12, as illustrated in FIG. 7C. The anodes 13 and the wiring 14 are formed through vacuum vapor deposition or sputtering so that the anodes 13 and the wiring 14 have thicknesses around 150 nm (step S4 in FIG. 10). The anodes 13 are formed so as to correspond one-to-one to the subpixels.

Figure 7D:
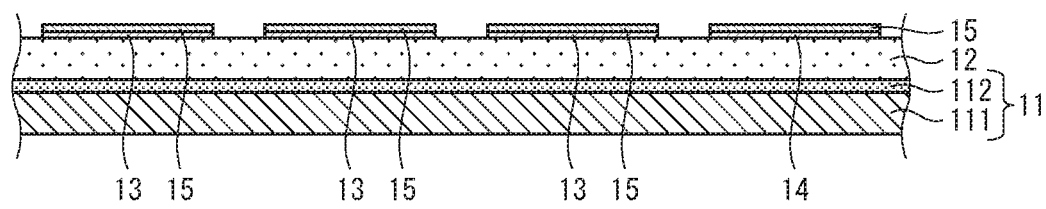

Next, the hole injection layers 15 are formed on the anodes 13 and the wiring 14, as illustrated in FIG. 7D (step S5 in FIG. 10). Note that the hole injection layer 15 on the wiring 14 is not necessarily formed. When the hole injection layers 15 are formed through ink application, the hole injection layers 15 are formed after forming the bank layer 16 and before forming the hole transport layers 17.

Next, a bank material layer 160 is formed on the hole injection layers 15 and the interlayer electrically-insulating layer 12 by applying a resin, as illustrated in FIG. 8A. An example of the resin used for forming the bank layer 16 is a phenolic resin, which is a positive photosensitive material. The bank material layer 160 is formed for example by uniformly applying, onto the hole injection layers 15 and the interlayer electrically-insulating layer 12, a solution in which the phenolic resin is dissolved in a solvent (such as mixed solvent of ethyl lactate and GBL), with use of spin coating or the like. Then, the bank layer 16 is formed by applying pattern exposure and developing to the bank material layer 160 (FIG. 8B and step S6 in FIG. 10), and then the bank layer 16 is baked (step S7 in FIG. 10). The bank layer 16 defines the openings 16a, which are regions in which the light-emitting layers 18 are to be formed, and openings 16b, which are to be contact regions in which electricity is supplied from the wiring 14 to the cathode 21. For example, the bank layer 16 is baked for 60 minutes at a temperature no lower than 150° C. and no higher than 210° C.

In forming the bank layer 16, a surface of the bank layer 16 may undergo surface processing with use of a predetermined alkaline solution, water, organic solvent, or the like, or may undergo plasma processing. Such processing of the bank layer 16 is performed in order to adjust a contact angle of the bank layer 16 relative to an ink (solution) to be applied to the openings 16a or to provide the surface of the bank layer 16 with water repellency.

Next, the hole transport layers 17 are formed by applying an ink containing a material for forming the hole transport layers 17 to the openings 16a, which are defined by the bank layer 16, and performing baking (drying) (step S8 in FIG. 10). Then, the light-emitting layers 18 are formed by applying an ink containing a material for forming the light-emitting layers 18 and performing baking (drying) (FIG. 8C and step S9 in FIG. 10).

Note that the hole transport layers 17 and the light-emitting layers 18 are not necessarily formed through a wet process, and may be formed through, for example, vacuum vapor deposition.

Next, the intermediate layer 19 is formed so as to be continuous on the light-emitting layers 18, the bank layer 16, and the hole injection layers 15 formed on the wiring 14, as illustrated in FIG. 9A (step S10 in FIG. 10). Specifically, the intermediate layer 19 is formed by depositing sodium fluoride through vacuum vapor deposition or sputtering.

Next, the organic functional layer 20 is formed on the intermediate layer 19, as illustrated in FIG. 9B (step S11 in FIG. 10). Specifically, the organic functional layer 20, which is made of an organic material doped with barium, is formed through co-depositing an organic material and barium.

Next, the cathode 21 and the sealing layer 22 are formed on the organic functional layer 20, as illustrated in FIG. 9C. Specifically, the cathode 21 is first formed through vacuum vapor deposition, sputtering, or the like using a material such as ITO or IZO (step S12 in FIG. 10). Then, the sealing layer 22 is formed on the cathode 21 through sputtering, chemical vapor deposition (CVD), or the like using SiN (step S13 in FIG. 10).

The organic EL display panel 100 is completed through the above processes. When forming the organic EL display panel 100 through the above processes, the Ba concentration in the organic functional layer 20 and the film thickness of the intermediate layer 19 are adjusted so as to be within the practicality region.

In some organic light-emitting devices of a top-emission-type, such as the organic EL display panel 100, the cathode may have a reduced thickness in order to provide a great light-emission efficiency. Reduction of contact resistance is especially beneficial in organic light-emitting devices in which the cathode has a reduced thickness, because an electrical resistivity of the cathode is high in such organic light-emitting devices, and thus a different amount of voltage is likely to be applied to different portions of the cathode in a panel surface.

Note that color filters, an upper substrate, or the like may be mounted and adhered onto the sealing layer 22.

Summary of Embodiment

As described above, in the organic EL display panel 100 pertaining to the embodiment as an example of an organic light-emitting device pertaining to one aspect of the present invention, the Ba concentration in the organic functional layer 20 and the film thickness of the intermediate layer 19 are adjusted so as to be within the practicality region. As a result, the contact resistance value is within a range suitable for practical use, differences in voltage applied to different ones of the pixels are reduced, and reduction of unevenness of luminance is achieved.

Note that the practicality region described above is a region in which 1≤x≤2, 20≤y≤40, and y≥20x is satisfied when the Ba concentration [wt %] in the organic functional layer 20 is plotted along the y-axis and the film thickness [nm] of the intermediate layer 19 is plotted along the x-axis.

MODIFICATIONS

Although explanation has been given on one aspect of the present invention based on the embodiment, the present invention should not be construed as being limited to the embodiment described above. The following modifications for example may be made.

1. Wiring

In the above embodiment, each portion of the wiring has a linear shape. However, the shape of the wiring should not be construed as being limited to this, and the wiring may have other shapes such as a mesh-like shape.

2. Electron Injection Layer

The organic EL display panel pertaining to the above embodiment may further include an electron injection layer in addition to the organic functional layer 20. The electron injection layer promotes injection of electrons from the cathode to the light-emitting layers. The electron injection layer can be made of, for example, a metal with a low work function such as lithium, barium, calcium, potassium, cesium, sodium, rubidium, a metal salt with a low work function such as lithium fluoride, and a metal oxide with a low work function such as barium oxide (BaO).

4. Hole Injection Layers and Hole Transport Layers

The organic EL display panel 100 pertaining to the above embodiment has the hole injection layers 15 and the hole transport layers 17 between the anodes 13 and the light-emitting layers 18, but the present invention should not be construed as being limited to this. The organic EL display panel 100 may have only one of the hole injection layers 15 and the hole transport layers 17. Further, the organic EL display panel 100 may have neither the hole injection layers 15 nor the hole transport layers 17.

5. Structure

The organic EL display panel 100 pertaining to the above embodiment is a top-emission type organic EL display panel in which light is emitted from a side of the organic EL display panel 100 opposite the substrate. However, the present invention should not be construed as being limited to this, and the organic EL display panel 100 may be a bottom-emission type organic EL display panel. When the organic EL display panel 100 is a bottom-emission type organic EL display panel, a single-layer structure made of a light-transmissive electrically conductive material may suffice the anodes 13.

6. Other Issues

In the above embodiment, an organic EL display panel is described as one example of the organic light-emitting device pertaining to one aspect of the present invention. However, the organic light-emitting device pertaining to one aspect of the present invention should not be construed as being limited to an organic EL display panel, and can be achieved as, for example, lighting devices.

INDUSTRIAL APPLICABILITY

The present invention is utilizable, for example, for organic EL display panels, lighting devices, and the like, and preferably utilizable for organic light-emitting devices used as displays in various types of display devices for households, public facilities, and business, television devices, displays for various electronic devices, lighting devices, and the like, and a production method of such organic light-emitting devices.

REFERENCE SIGNS LIST 11 substrate
13 anode
14 wiring
18 light-emitting layer
19 intermediate layer
20 organic functional layer
21 cathode
100 organic EL display panel

The invention claimed is:

1. An organic light-emitting device, comprising:
a substrate;
an anode disposed above the substrate;
a wiring disposed above the substrate, the wiring being spaced away from the anode in a direction parallel to a main surface of the substrate;
a light-emitting layer disposed above the anode and containing an organic light-emitting material;
an intermediate layer disposed on the light-emitting layer and above the wiring, the intermediate layer being continuous over the light-emitting layer and the wiring and containing a fluoride of a first metal, the first metal being an alkali metal or an alkaline earth metal;
an organic functional layer disposed on the intermediate layer, the organic functional layer being continuous over the light-emitting layer and the wiring and made of an organic material doped with a second metal, the organic material having at least one of an electron transporting property and an electron injection property, the second metal having a property of cleaving a bond between the first metal and fluorine in the fluoride of the first metal; and
a cathode disposed on the organic functional layer, the cathode being continuous over the light-emitting layer and the wiring, wherein
0.1≤x≤4, 3≤y≤50, and y≥20x, where
x denotes a film thickness [nm] of the intermediate layer and y denotes a dope concentration [wt %] of the second metal in the organic functional layer.

2. An organic light-emitting device, comprising:
a substrate;
an anode disposed above the substrate;
a wiring disposed above the substrate, the wiring being spaced away from the anode in a direction parallel to a main surface of the substrate;
a light-emitting layer disposed above the anode and containing an organic light-emitting material;
an intermediate layer disposed on the light-emitting layer and above the wiring, the intermediate layer being continuous over the light-emitting layer and the wiring and containing a fluoride of a first metal, the first metal being an alkali metal or an alkaline earth metal;
an organic functional layer disposed on the intermediate layer, the organic functional layer being continuous over the light-emitting layer and the wiring and made of an organic material doped with a second metal, the organic material having at least one of an electron transporting property and an electron injection property, the second metal having a property of cleaving a bond between the first metal and fluorine in the fluoride of the first metal; and a cathode disposed on the organic functional layer, the cathode being continuous over the light-emitting layer and the wiring, wherein $1 \leq x \leq 2$, $20 \leq y \leq 40$, and $y \geq 20x$, where x denotes a film thickness [nm] of the intermediate layer and y denotes a dope concentration [wt %] of the second metal in the organic functional layer.

3. A production method of an organic light-emitting device, comprising:

forming an anode and a wiring above a substrate, the wiring being spaced away from the anode in a direction parallel to a main surface of the substrate;

forming a light-emitting layer containing an organic light-emitting material above the anode;

forming an intermediate layer on the light-emitting layer and above the wiring, the intermediate layer being continuous over the light-emitting layer and the wiring and containing a fluoride of a first metal, the first metal being an alkali metal or an alkaline earth metal;

forming an organic functional layer on the intermediate layer, the organic functional layer being continuous over the light-emitting layer and the wiring and made of an organic material doped with a second metal, the organic material having at least one of an electron transporting property and an electron injection property, the second metal having a property of cleaving a bond between the first metal and fluorine in the fluoride of the first metal; and forming a cathode on the organic functional layer, the cathode being continuous over the light-emitting layer and the wiring, wherein $0.1 \leq x \leq 4$, $3 \leq y \leq 50$, and $y \geq 20x$, where x denotes a film thickness [nm] of the intermediate layer and y denotes a dope concentration [wt %] of the second metal in the organic functional layer.

4. A production method of an organic light-emitting device, comprising:

forming an anode and a wiring above a substrate, the wiring being spaced away from the anode in a direction parallel to a main surface of the substrate;

forming a light-emitting layer containing an organic light-emitting material above the anode;

forming an intermediate layer on the light-emitting layer and above the wiring, the intermediate layer being continuous over the light-emitting layer and the wiring and containing a fluoride of a first metal, the first metal being an alkali metal or an alkaline earth metal;

forming an organic functional layer on the intermediate layer, the organic functional layer being continuous over the light-emitting layer and the wiring and made of an organic material doped with a second metal, the organic material having at least one of an electron transporting property and an electron injection property, the second metal having a property of cleaving a bond between the first metal and fluorine in the fluoride of the first metal; and forming a cathode on the organic functional layer, the cathode being continuous over the light-emitting layer and the wiring, wherein $1 \leq x \leq 2$, $20 \leq y \leq 40$, and $y \geq 20x$, where x denotes a film thickness [nm] of the intermediate layer and y denotes a dope concentration [wt %] of the second metal in the organic functional layer.

* * * * *